United States Patent
Ishigami et al.

(10) Patent No.: US 8,854,126 B2
(45) Date of Patent: Oct. 7, 2014

(54) SEMICONDUCTOR DEVICE AND OFFSET VOLTAGE CORRECTING METHOD

(71) Applicant: Renesas Electronics Corporation, Kanagawa (JP)

(72) Inventors: Junichi Ishigami, Kanagawa (JP); Yasuhiro Koga, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/104,776

(22) Filed: Dec. 12, 2013

(65) Prior Publication Data

US 2014/0167852 A1    Jun. 19, 2014

(30) Foreign Application Priority Data

Dec. 14, 2012   (JP) .................................. 2012-273132

(51) Int. Cl.
   *H03F 3/45* (2006.01)
(52) U.S. Cl.
   USPC .............................................. 330/69; 330/86
(58) Field of Classification Search
   CPC .......... H03F 3/45179; H03F 2200/375; H03F 2203/45212; H03F 2200/405; H03F 3/45973; H03F 2200/261; H03F 3/45744; H03F 2203/45288; H03F 2203/45311; H03F 3/4508; H03F 3/45188; H03F 1/083; H03F 1/301
   USPC ........................... 330/9, 51, 69, 86, 260, 261
   See application file for complete search history.

(56) References Cited

U.S. PATENT DOCUMENTS

| | | | |
|---|---|---|---|
| 7,777,565 B2 * | 8/2010 | Tanizawa | 330/69 |
| 8,098,098 B2 * | 1/2012 | Fukuzawa | 330/259 |
| 8,183,916 B2 * | 5/2012 | Byon | 330/69 |
| 2006/0284671 A1 * | 12/2006 | Ohba | 330/9 |

FOREIGN PATENT DOCUMENTS

| | | |
|---|---|---|
| JP | 9-148930 A | 6/1997 |
| JP | 2000-174570 A | 6/2000 |

* cited by examiner

*Primary Examiner* — Khanh V Nguyen
(74) *Attorney, Agent, or Firm* — Foley & Lardner LLP

(57) ABSTRACT

A semiconductor device includes: an amplifier circuit that has an inverting input terminal, a non-inverting input terminal, and an output terminal; a first variable voltage source that generates a first bias voltage having a voltage value corresponding to a first set value; a second variable voltage source that generates a second bias voltage having a voltage value corresponding to a second set value; a first resistor whose one end is connected to the inverting input terminal; a second resistor that is connected between the output terminal and the inverting input terminal; a third resistor whose one end is connected to the non-inverting input terminal; and a fourth resistor that is connected between the second variable voltage source and the non-inverting input terminal. The first bias voltage is provided to the other end of the first resistor. An input signal is provided to the other end of the third resistor.

13 Claims, 16 Drawing Sheets

Fig. 5
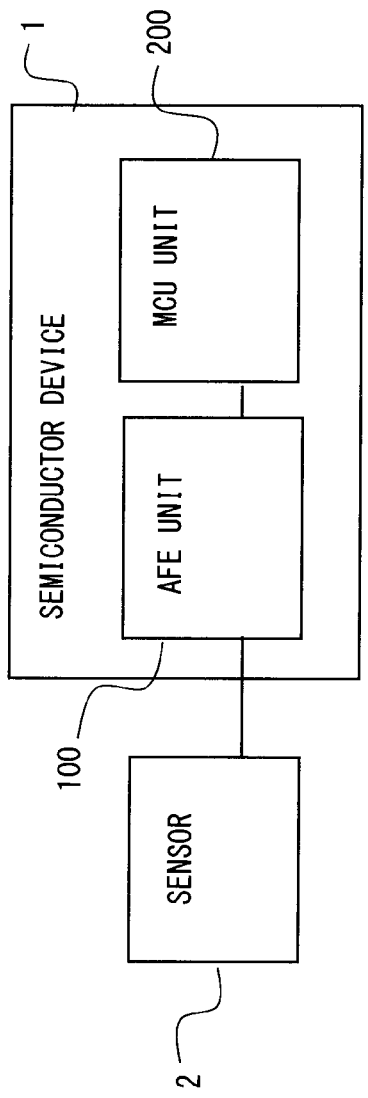
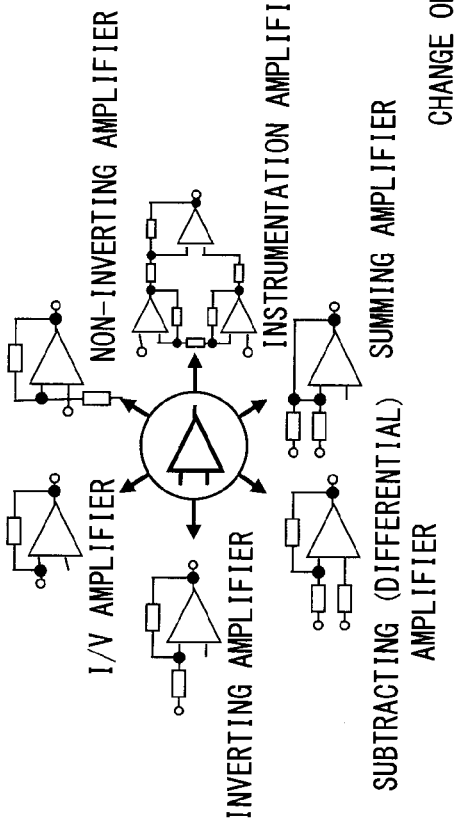

SEMICONDUCTOR DEVICE AND OFFSET VOLTAGE CORRECTING METHOD

CROSS-REFERENCE TO RELATED APPLICATIONS

This application is based upon and claims the benefit of priority from Japanese patent application No. 2012-273132, filed on Dec. 14, 2012, the disclosure of which is incorporated herein in its entirety by reference.

BACKGROUND

1. Technical Field

The present invention relates to a semiconductor device and an offset voltage correcting method. More particularly, the present invention relates to a semiconductor device having an amplifier circuit and an offset voltage correcting method.

2. Background Art

An amplifier circuit has a first input terminal and a second input terminal, and operates as follows. A bias voltage is applied to one of the first input terminal and the second input terminal. An input signal is provided to at least one of the first input terminal and the second input terminal, and the amplifier circuit outputs an output signal employing the bias voltage as the operating point. The amplifier circuit ideally has a virtual short-circuit characteristic in which the voltage difference between the first input terminal and the second input terminal becomes zero in the non-signal state where no input signal is input. However, practical anally, the voltage difference between the first input terminal and the second input terminal is present even in the non-signal state. This voltage difference is referred to as the offset voltage. This offset voltage causes a shift of the operating point of the amplifier circuit, and therefore it poses a problem.

In order to cope with the problem, Patent Literature 1 (Japanese Unexamined Patent Application Publication No. 2000-174570) and 2 (Japanese Unexamined Patent Application Publication No. 09-148930) each disclose a technique of correcting the offset voltage. Patent Literature 1 discloses a technique of adjusting gain using a variable resistor. Further, Patent Literature 2 discloses a technique of directly adjusting the bias by an AD converter.

As described above, according to Patent Literature 1 and 2, the offset voltage is corrected by adjusting the bias voltage. However, when the offset voltage is corrected using the techniques of Patent Literature 1 and 2, since the correction component of the bias voltage is amplified and output by the amplifier circuit, there is a problem that a high-precision correction of the bias voltage must be carried out.

Other problems and novel features will become apparent from the description of the present specification and accompanying drawings.

SUMMARY

According to one embodiment, a semiconductor device sets an ideal value for the operating point of an amplifier circuit by a first bias voltage, which is generated according to a first set value at a first variable voltage source. Further, the semiconductor device corrects the shift amount with reference to the ideal value for the operating point of the amplifier circuit by a second bias voltage, which is generated according to a second set value at a second variable voltage source.

Advantageous Effect of the Invention

According to one embodiment described above, the offset voltage of the amplifier circuit can be corrected with high precision.

BRIEF DESCRIPTION OF THE DRAWINGS

The above and other aspects, advantages and features of the present invention will become more apparent from the following description of certain embodiments taken in conjunction with the accompanying drawings, in which:

FIG. 5 is a configuration diagram of a sensor system according to a fourth embodiment;

DETAILED DESCRIPTION

Figure 1:
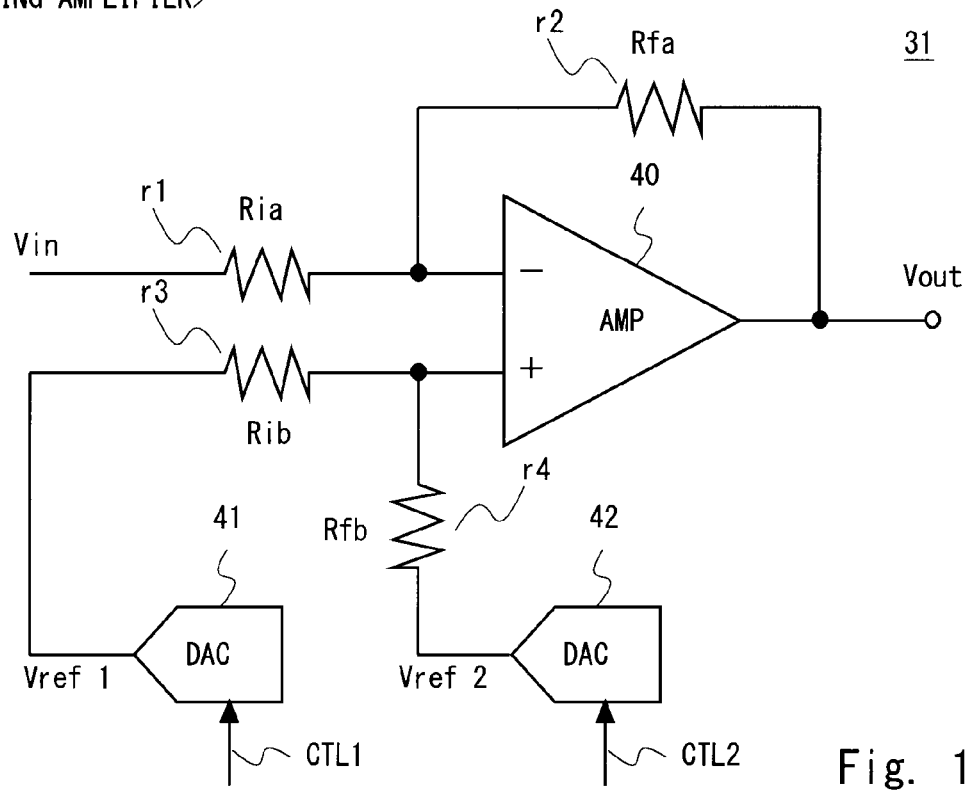
FIG. 1 is a block diagram showing the configuration of an inverting amplifier according to a first embodiment.

For the sake of clarification of the description, parts of the following description and some of the accompanying drawings are omitted or simplified as appropriate. Further, the elements illustrated in the drawings as functional blocks carrying out various processes can be configured in hardware using a CPU, memory, and other circuitry, or realized in software using a program loaded on memory or the like. Accordingly, a person skilled in the art can understand that these functional blocks can be realized in various manners, i.e., solely in hardware, solely in software, or combinations thereof, and the present invention is not limited to any one of these. Note that, throughout the drawings, identical reference symbols are allotted to identical elements, and any repetitive description is omitted necessary.

A semiconductor device according to the present embodiment has: an amplifier circuit that has an inverting input terminal, a non-inverting input terminal, and an output terminal; a first variable voltage source that generates a first bias voltage having a voltage value corresponding to a first set value; a second variable voltage source that generates a second bias voltage having a voltage value corresponding to a second set value; a first resistor whose one end is connected to the inverting input terminal; a second resistor that is connected between the output terminal and the inverting input terminal; a third resistor whose one end is connected to the non-inverting input terminal; and a fourth resistor that is connected between the second variable voltage source and the non-inverting input terminal. The first bias voltage is provided to at least one of other end of the first resistor and other end of the third resistor. An input signal is provided to at least one of the other end of the first resistor and the other end of the third resistor. Thus, the offset voltage in the amplifier circuit can be corrected with high precision. For example, using a plurality of variable voltage sources of relatively low precision and low cost, correction of the offset voltage can be performed with high precision. It is thus not necessary to use a high-precision, expensive variable voltage source to correct the set voltage with high precision. At the same time, a common voltage being the input signal and the first bias voltage can be adjusted to have a same potential.

Further, in connection with the semiconductor device, desirably, the first resistor and the third resistor have an identical resistance value, and the second resistor and the fourth resistor have an identical resistance value. As a result, the high precision of the correction of the offset voltage can be further enhanced.

Still further, the first bias voltage should be provided to the other end of the third resistor and the input signal should be provided to the other end of the first resistor. Thus, the offset voltage in the inverting amplifier can be corrected high precision.

Further, the first bias voltage desirably has a voltage value corresponding to the ideal value for the amplitude center of the output signal being output from the amplifier circuit, and the second bias voltage has a voltage value corresponding to the shift amount with reference to the amplitude center. Thus, using a same output signal from the amplifier circuit, the offset voltage can be corrected by the first bias voltage over a wide range, and can be corrected over a limited range by the second bias voltage. Accordingly, the high precision of the correction of the offset voltage can be further enhanced.

Still further, desirably, the first variable voltage source is a digital-to-analog converter that converts an analog signal obtained by conversion of the output signal output from the amplifier circuit into a digital signal based on the first set value to generate the first bias voltage, and the second variable voltage source is a digital-to-analog converter that converts the analog signal into a digital signal based on the second set value to generate the second bias voltage. Thus, the output signal from the amplifier circuit can be used as the reference voltage of the amplifier circuit.

Further, the semiconductor device according to the present embodiment can also be described as follows. That is, the semiconductor device includes an amplifier circuit that has an inverting input terminal, a non-inverting input terminal, and an output terminal; a first resistor whose one end is connected to the inverting input terminal; a second resistor that is connected between the output terminal and the inverting input terminal; a third resistor whose one end is connected to the non-inverting input terminal; a fourth resistor whose one end is connected to the non-inverting input terminal; a first variable voltage source that generates a first bias voltage having a voltage value corresponding to a first set value, the first variable voltage source providing the first bias voltage to at least one of other end of the first resistor and other end of the third resistor; and a second variable voltage source that generates a second bias voltage having a voltage value corresponding to a second set value, the second variable voltage source providing the second bias voltage to other end of the fourth resistor. In the semiconductor device, an ideal value for an operating point of the amplifier circuit is set by the first bias voltage, and a shift amount of the amplifier circuit with reference to the ideal value for the operating point is corrected by the second bias voltage. Thus, the offset voltage in the amplifier circuit can be finely corrected. For example, using a plurality of variable voltage sources which have relatively low-precision and are inexpensive, correction of the offset voltage can be performed with high precision. Thus, it is not necessary to use a high-precision, expensive variable voltage source to correct the offset voltage with high precision. At the same time, the common voltage being an input signal and the first bias voltage can be adjusted to have an same potential.

First Embodiment

Inverting Amplifier

In the following, in a first embodiment, a description will be given of an inverting amplifier which is one example of the semiconductor device described above. FIG. 1 is a block diagram showing the configuration of an inverting amplifier 31 according to the first embodiment. The inverting amplifier 31 is a semiconductor device that includes an amplifier circuit 40, resistors r1 to r4, and DACs 41 and 42.

The amplifier circuit 40 has an inverting input terminal, a non-inverting input terminal, and an output terminal. The DAC 41 is a first variable voltage source that generates a reference voltage Vref1 (a first bias voltage) having a voltage value corresponding to a control signal CTL1 (a first set value). The DAC 42 is a second variable voltage source that generates reference voltage Vref2 (a second bias voltage) having a voltage value corresponding to a control signal CTL2 (a second set value). Note that the control signals CTL1 and CTL2 may each be an externally set signal value, or a signal value that is dynamically set by a control circuit (not shown) in accordance with measured values such as an input signal Vin, the reference voltages Vref1 and Vref2 and an output signal Vout.

The resistor r1 is a first resistor that has a resistance value Ria. One end of the resistor r1 is connected to the inverting input terminal of the amplifier circuit 40, and the input signal Vin is provided to other end of the resistor r1. The resistor r2 is a second resistor that has a resistance value Rfa. The resistor r2 is connected between the output terminal and the inverting input terminal of the amplifier circuit 40. The resistor r3 is a third resistor that has a resistance value Rib. The resistor r3 is connected between the non-inverting input terminal of the amplifier circuit 40 and the DAC 41. The resistor r4 is a fourth resistor that has a resistance value Rfb. The resistor r4 is connected between the DAC 42 and the non-inverting input terminal of the amplifier circuit 40.

Here, the voltage value at the non-inverting input terminal of the amplifier circuit 40 in the inverting amplifier 31 shown in FIG. 1 can be obtained by the following formula (1)

$$v+ = \frac{(Vref1 - Vref2)Rfb}{Rib + Rfb} + Vref2 \qquad (1)$$

Further, the voltage value at the inverting input terminal of the amplifier circuit 40 in the inverting amplifier 31 shown in FIG. 1 can be obtained by the following formula (2).

$$v- = \frac{(Vout - Vin)Ria}{Ria + Rfa} + Vin \qquad (2)$$

Here, the state where the offset voltage of the amplifier circuit 40 in the inverting amplifier 31 assumes "0" is reached when the following formula (3) is satisfied.

$$v+ = v- \qquad (3)$$

Substituting formulas (1) and (2) into formula (3), the following formula (4) is derived.

$$Vout = -\frac{Rfa}{Ria}Vin + \frac{Ria + Rfa}{Ria(Rib + Rfb)}(Rfb \cdot Vref1 + Rib \cdot Vref2) \qquad (4)$$

Accordingly, when reference voltages Vref1 and Vref2 that satisfy formula (4) are set, the offset voltage of the inverting amplifier 31 can be corrected. Thus, the offset voltage can be corrected with high precision.

In particular, when the resistance values Ria, Rfa, Rib, and Rfb satisfy the relationship of the following formula (5), the foregoing formula (4) can be expressed as the following formula (6).

$$Ria = Rib = Ri, Rfa = Rfb = Rf \qquad (5)$$

$$Vout = -\frac{Rf}{Ri}(Vin - Vref1) + Vref2 \qquad (6)$$

Then, in this case, the gain value is expressed by formula (7).

$$\text{gain: } -\frac{Rf}{Ri} \qquad (7)$$

From formulas (6) and (7), it can be said that the reference voltage Vref2 which is the output of the DAC 42 is not multiplied by the gain of the amplifier circuit 40. Therefore, it can be said that the adjustment width, i.e., the resolution, is fine, and the input/output bias voltage of the amplifier circuit 40 can be adjusted with high precision. Accordingly, the high-precision correction of the offset voltage can be further enhanced.

Figure 2:
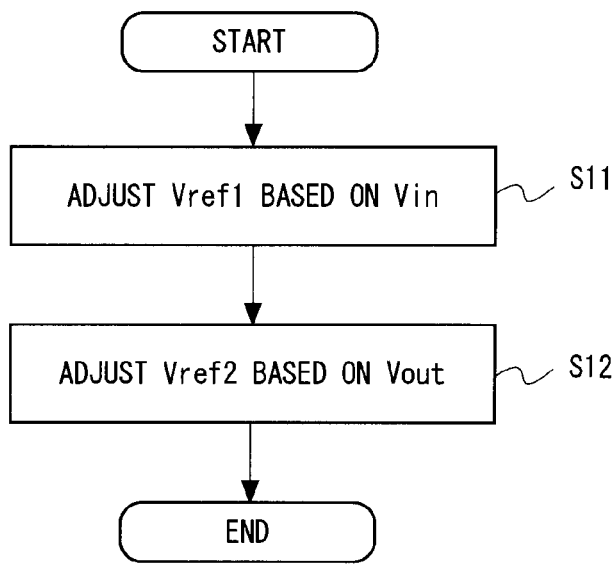
FIG. 2 is a flowchart showing the flow of a correction procedure of an offset voltage according to the first embodiment.

FIG. 2 is a flowchart showing the flow of the correction procedure of the offset voltage according to a first embodiment. Note that the correction procedure can be realized by an inspection apparatus performing each process, a control circuit in which each process function is installed, or a processor reading a program including each process from memory and executing the program. In the following, a description will be given of a case where the bias voltage correction process is executed using a control circuit.

Firstly, the control circuit adjusts the reference voltage Vref1 based on the input signal Vin (S11). That is, the control circuit sets the ideal value for the operating point of the amplifier circuit 40 by the reference voltage Vref1 which is the first bias voltage. For example, the control circuit measures the input signal Vin and the reference voltage Vref1 input to the inverting amplifier 31, and sets the control signal CTL1 so that the reference voltage Vref1 assumes the same potential as the input signal Vin. In accordance therewith, the DAC 41 generates the reference voltage Vref1 in accordance with the control signal CTL1. As a result, it becomes possible to make a correction such that the operating point of the amplifier circuit 40 approximates the ideal value.

Next, the control circuit adjusts the reference voltage Vref2 based on the output signal Vout (S12). That is, the control circuit corrects the shift amount relative to the ideal value of the operating point of the amplifier circuit 40, based on the reference voltage Vref2 which is the second bias voltage. In particular, since the reference voltage Vref2 is not amplified by the gain of the amplifier circuit 40 when the foregoing formula (5) is satisfied, the output signal Vout can be finely adjusted.

For example, the DAC 42 is controlled so that the offset voltage by the amplifier circuit 40 is cancelled and the output bias voltage of the amplifier circuit 40 is optimized. Here, in order to achieve such an optimization, for example, the output dynamic range of the amplifier circuit 40 should be maximized.

Another example is based on the premise that an A/D converter, which is connected to the rear stage of the amplifier circuit 40 and receives Vout as the input signal, is provided. Then, the control circuit detects the output of the A/D converter, and feeds back the result to the control of the DAC 42. Thus, the reference voltage Vref2 can be adjusted to the optimum voltage.

Here, in Step S11, it is desirable that the control circuit sets the first set value to the first variable voltage source so that the first bias voltage approximates the signal value of the input signal of the amplifier circuit; and thereafter, the control circuit sets the second set value to the second variable voltage source to generate the second bias voltage that causes the non-inverting input terminal and the inverting input terminal to approximate each other.

Further, when the first variable voltage source and the second variable voltage source are each a digital-to-analog converter, the first variable voltage source should convert an analog signal, which is obtained by converting an output signal of the amplifier circuit, into a digital signal based on the first set value, to thereby generate the first bias voltage. The second variable voltage source should convert the analog signal into a digital signal based on the second set value, to thereby generate the second bias voltage.

Second Embodiment

Non-Inverting Amplifier

A non-inverting amplifier 32 according to a second embodiment is an example of a variation of the inverting amplifier 31 described above. That is, the first bias voltage may be provided to other end of the first resistor, and the input signal may be provided to other end of the third resistor. Thus, the offset voltage in the non-inverting amplifier can be corrected with high precision.

Figure 3:
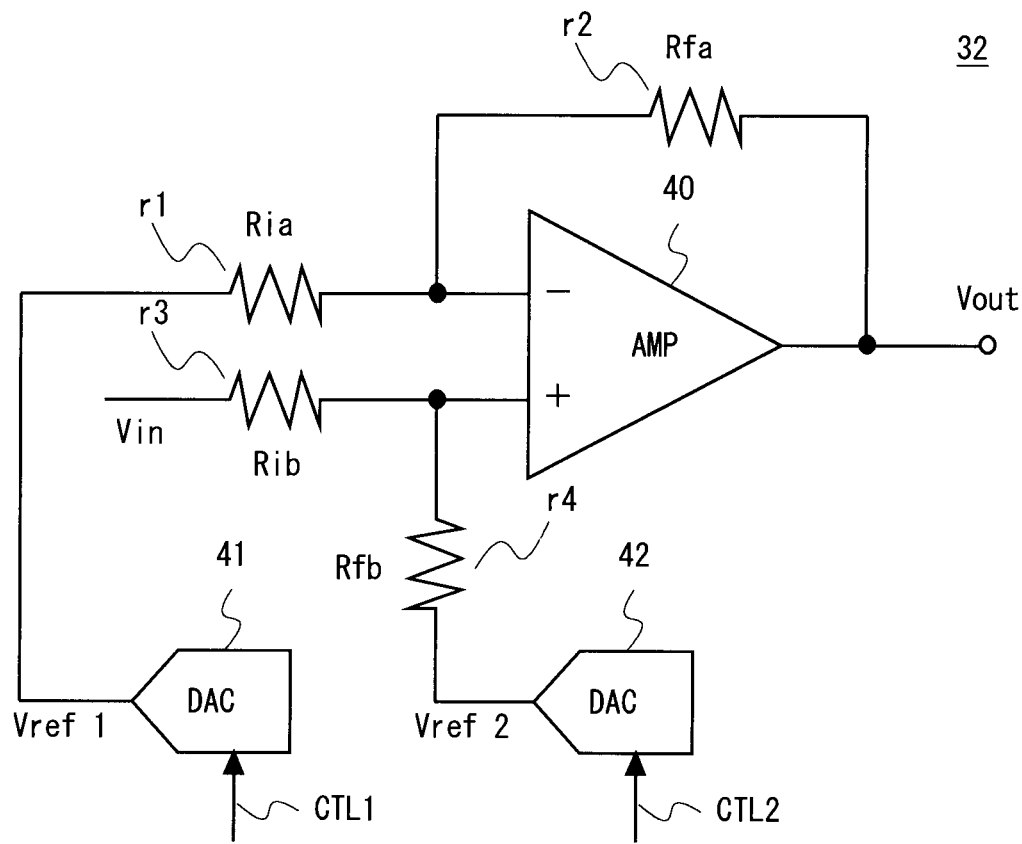
FIG. 3 is a block diagram showing the configuration of a non-inverting amplifier according to a second embodiment.

FIG. 3 is a block diagram showing the configuration of the non-inverting amplifier 32 according to the second embodiment. The difference between the configuration of the non-inverting amplifier 32 and the inverting amplifier 31 described above is as follows. That is, one end of the resistor r1 is connected to the inverting input terminal of the amplifier circuit 40, and other end of the resistor r1 is connected to the DAC 41. Further, one end of the resistor r3 is connected to the non-inverting input terminal of the amplifier circuit 40, and the input signal Vin is provided to other end of the resistor r3. Since the rest of the configuration of the amplifier 32 is equivalent to that of the inverting amplifier 31, the detailed description is not repeated.

In this manner, the non-inverting amplifier 32 according to the second embodiment can also, like the inverting amplifier 31, achieve a fine adjustment width, i.e., high resolution, and the input/output bias voltage of the amplifier circuit 40 can be adjusted with high precision.

Here, the voltage value at the non-inverting input terminal of the amplifier circuit 40 in the non-inverting amplifier 32 shown in FIG. 3 can be expressed by the following formula (8).

$$v+ = \frac{(Vin - Vref2)Rfb}{Rib + Rfb} + Vref2 \qquad (8)$$

Further, the voltage value at the inverting input terminal of the amplifier circuit 40 in the non-inverting amplifier 32 shown in FIG. 3 can be expressed by the following formula (9).

$$v- = \frac{(Vref1 - Vout)Rfa}{Ria + Rfa} + Vout \qquad (9)$$

Here, the state where the offset voltage of the amplifier circuit 40 in the non-inverting amplifier 32 assumes "0" reached when the foregoing formula (3) is satisfied. Substituting formulas (8) and (9) into formula (3), when the resistance values Ria, Rfa, Rib, and Rfb satisfy the foregoing formula (5), the following formula (10) is derived.

$$Vout = \frac{Rf}{Ri}(Vin - Vref1) + Vref2 \qquad (10)$$

Then, in this case, the gain value is expressed by formula (11).

$$\text{gain: } \frac{Rf}{Ri} \qquad (11)$$

In this case also, it can be said that, from formulas (10) and (11), the reference voltage Vref2 which is the output of the DAC 42 is not multiplied by the gain of the amplifier circuit 40. Accordingly, it can be said that the adjustment width, i.e., the resolution, is fine, and the input/output bias voltage of the amplifier circuit 40 can be adjusted with high precision.

Hence, the non-inverting amplifier 32 can also, like the inverting amplifier 31, correct the offset voltage with an enhanced high precision.

Third Embodiment

Summing Amplifier

A summing amplifier 33 according to a third embodiment is an example of a variation of the inverting amplifier 31 described above. That is, the first bias voltage may be provided to the other end of the third resistor, and the input signal may be provided to the other end of the first resistor. A fifth resistor may be further included. One end of the fifth resistor may be connected to the inverting input terminal. Except for the foregoing input signal, other input signal may be provided to other end of the fifth resistor. Thus, the offset voltage in the summing amplifier can be corrected with high precision.

Figure 4:
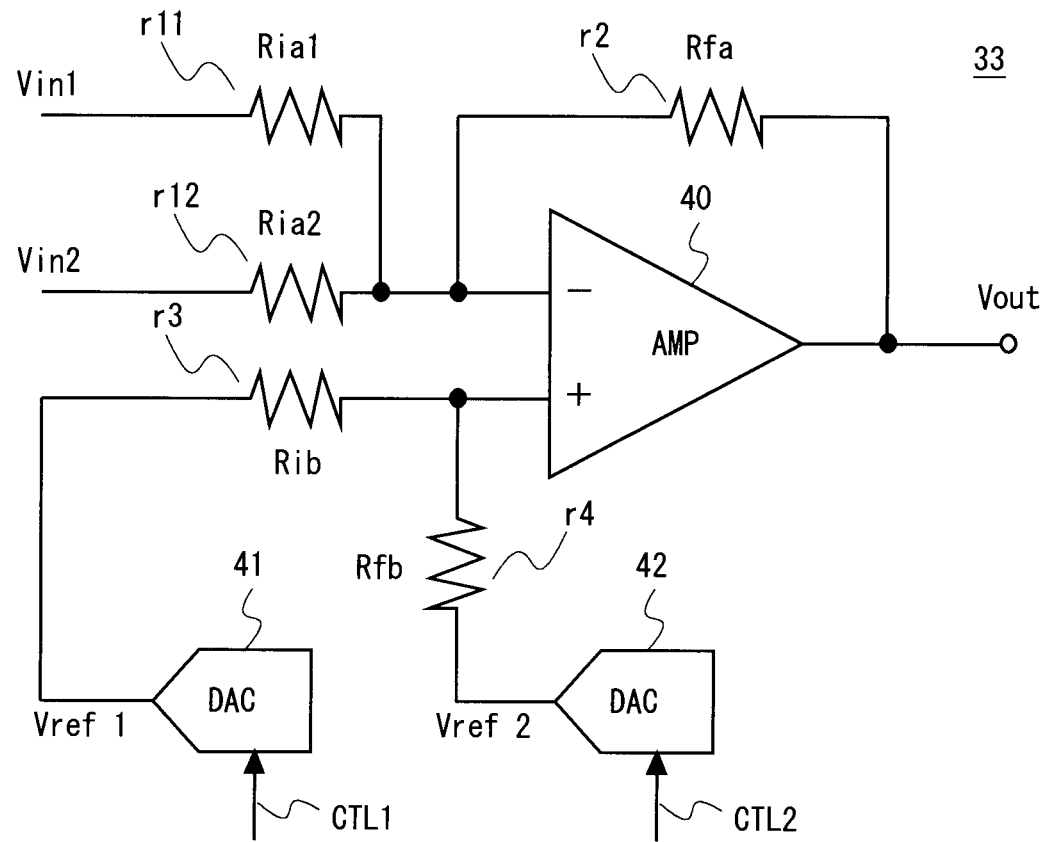
FIG. 4 is a block diagram showing the configuration of a summing amplifier according to a third embodiment.

FIG. 4 is a block diagram showing the configuration of the summing amplifier 33 according to the third embodiment. The difference between the configuration of the summing amplifier 33 and that of the inverting amplifier 31 described above is as follows. That is, in place of the resistor r1, the resistors r11 and r12 are connected in parallel. Here, the resistor r1 has a resistance value Ria1. One end of the resistor r1 is connected to the inverting input terminal, and an input signal Vin1 is provided to other end of the resistor r1. Further, the resistor r2 has a resistance value Ria2. One end of the resistor r2 is connected to the inverting input terminal, and an input signal Vin2 is provided to other end of the resistor r2. Since the rest of the configuration is equivalent to that of the inverting amplifier 31, the detailed description is not repeated.

In this manner, the summing amplifier 33 according to the third embodiment can also, like the inverting amplifier 31, achieve a fine adjustment width, i.e., high resolution, and the input/output bias voltage of the amplifier circuit 40 can be adjusted with high precision.

Fourth Embodiment

Configurable Amplifier

In a fourth embodiment, a description will be given of the configuration and method by which the offset voltage can be corrected with high precision in a configurable amplifier, which is a semiconductor device whose circuit configuration and circuit characteristics can be modified.

In order to facilitate understanding of the semiconductor device according to the present embodiment, firstly, a description will be given of the semiconductor device according to an embodiment. FIG. 5 shows the configuration of a sensor system including the semiconductor device according to the present embodiment.

FIG. 5 is a configuration diagram of the sensor system according to the fourth embodiment. The sensor system includes a sensor 2 and a semiconductor device 1 connected to the sensor 2.

As the sensor 2, various sensors such as a current output sensor that outputs a current in accordance with a detection result, a voltage output sensor that outputs a voltage in accordance with a detection result, and a sensor that outputs a faint differential signal in accordance with a detection result may be used.

The semiconductor device 1 includes a processing unit (e.g., MCU unit 200) and an analog front-end unit (e.g., AFE unit 100). The semiconductor device 1 is a SoC (System-ona-chip) on which a semiconductor chip of the MCU unit 200 and a semiconductor chip of the AFE unit 100 are integrated into one semiconductor device, for example. Note that the semiconductor device 1 may be a semiconductor device integrated into one chip including the MCU unit 200 and the AFE unit 100. Alternatively, there may be a semiconductor device including only the MCU unit 200 and a semiconductor device including only the AFE unit 100. Hereinafter, a device including both the AFE unit 100 and the MCU unit 200 may be referred to as the semiconductor device 1, and a device including only the AFE unit 100 may be also be referred to as the semiconductor device 1.

The MCU unit (processing unit) 200 is a microcontroller that converts a measurement signal (detection signal) of the sensor 2 that is input through the AFE unit 100 from analog to digital and performs control processing in accordance with a detection result. Further, the MCU unit 200 outputs a command for changing the settings of the configuration and characteristics of the AFE unit 100 to the AFE unit 100.

The AFE unit (analog input unit) 100 is an analog circuit that performs analog front-end processing such as amplification and filtering on the measurement signal that is output from the sensor 2 to generate a signal that is processable by the MCU unit 200. Further, the AFE unit 100 can change in its topology (circuit format and circuit configuration) and parameter (circuit characteristics) as shown in FIG. 5.

As shown in the FIG. 5, it is possible to change from the configuration of an operational amplifier circuit to an I/V amplifier, a subtracting (differential) amplifier, a summing amplifier, an inverting amplifier, a non-inverting amplifier, and an instrumentation amplifier. Further, as shown in a parameter example of a non-inverting amplifier, a change of operating point, a change of gain, and adjustment of offset can be made.

Figure 6:
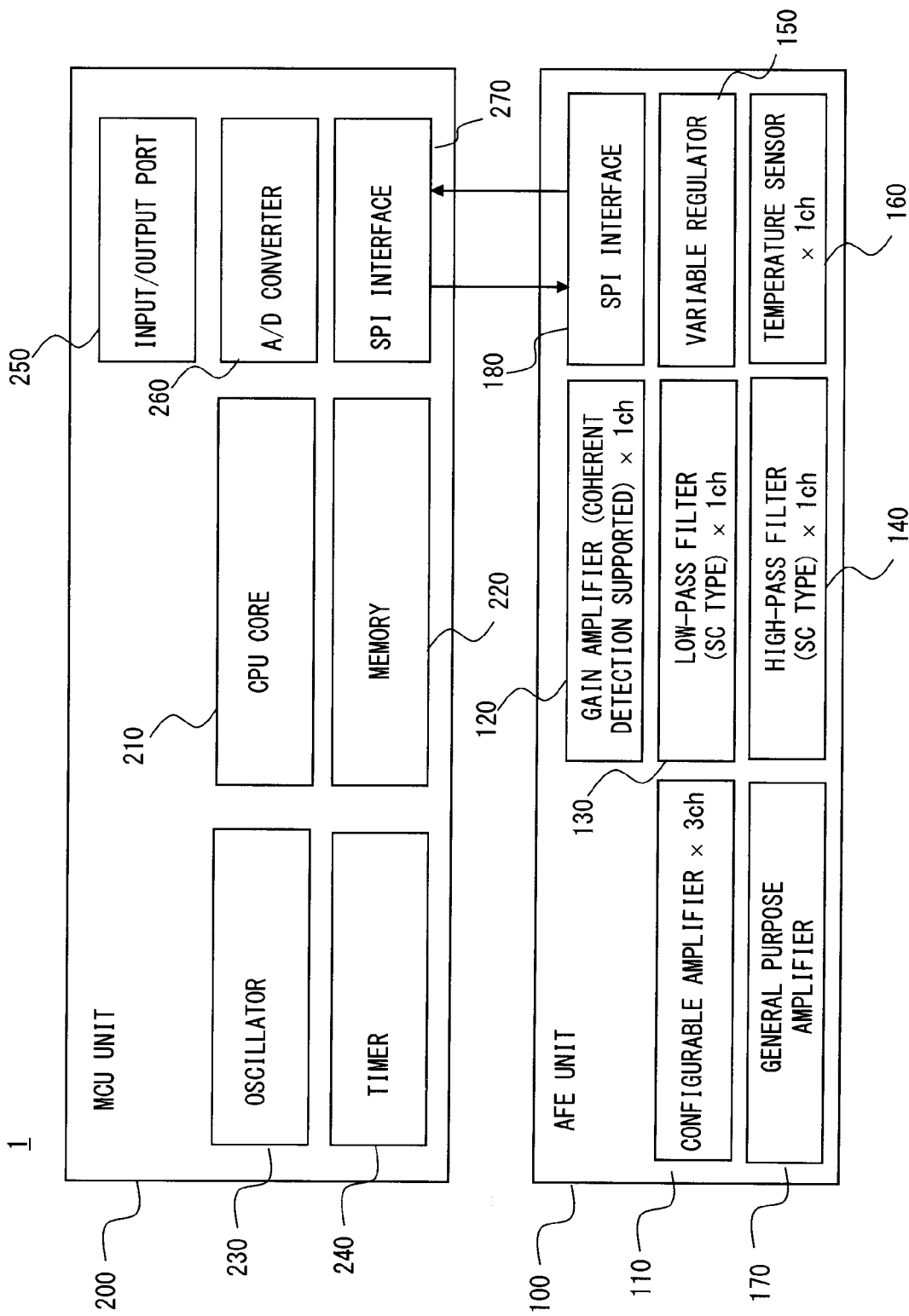
FIG. 6 is a circuit block diagram of a semiconductor device according to the fourth embodiment.

FIG. 6 shows a circuit block of the semiconductor device 1. As shown in FIG. 6, the MCU unit 200 includes a CPU core 210, a memory 220, an oscillator 230, a timer 240, an input/output port 250, an A/D converter 260, and a communication interface (e.g., SPI (Serial Peripheral Interface) 270). Note that the MCU unit 200 includes other circuits for implementing the function of a microcontroller, such a DMA and various arithmetic circuits, for example.

The CPU core 210 executes a program stored to the memory 220 and performs control processing according to the program. The memory 220 stores the program to be executed by the CPU core 210 and various data. The memory 220 stores, as one of the various data, a plurality of commands that specify a circuit format and a circuit configuration of a circuit composed of a plurality of analog circuit elements that are included in the AFE unit 100. The oscillator 230 generates an operating clock of the MCU unit 200 and further supplies the clock to the AFE unit 100 according to need. The timer 240 is used for the control operation of the MCU unit 200.

The input/output port 250 is an interface for inputting and outputting data or the like to and rom external devices of the semiconductor device 1, and it is connectable to an external computer device or the like as described later, for example.

The A/D converter 260 converts a measurement signal of the sensor 2 that is input through the AFE unit 100 from analog to digital. The power of the A/D converter 260 is supplied from the AFE unit 100.

The SPI (Serial Peripheral Interface) interface 270 is an interface for inputting and outputting data or the like to and from the AFE unit 100. Note that the SPI interface 270 is a general-purpose serial interface, and another microcontroller or microcomputer can connect to the AFE unit 100 if it supports SPI.

The semiconductor device 1 shown in FIG. 6 has a configuration compatible with general-purpose applications. To be specific, a complete AFE circuit for sensor is mounted to allow connection with sensors of various types and characteristics. Specifically, the AFE unit 100 includes a configurable amplifier 110, a gain amplifier supporting synchronous detection (which is also referred to hereinafter as a gain amplifier) 120, a Switched Capacitor (SC) low-pass filter (hereinafter as a low-pass filter) 130, a SC high-pass filter (hereinafter as a high-pass filter) 140, a variable regulator 150, a temperature sensor 160, a general-purpose amplifier 170, and an SPI interface 180.

The configurable amplifier 110 is an amplification circuit that amplifies a signal which is input from the outside such as sensor 2, and its circuit format, characteristics and operation can be set according to control from the MCU unit 200 (e.g., command transmitted from the MCU unit 200). The configurable amplifier 110 includes 3ch amplifiers, which are, three amplifiers. Many different circuit configurations can be implemented by the three amplifiers.

The gain amplifier 120 is an amplification circuit supporting synchronous detection that amplifies an output of the configurable amplifier 110 and a signal input from the outside such as the sensor 2, and its characteristics and operation can be set according to control from the MCU unit 200.

The low-pass filter 130 is an SC filter that removes high-frequency components of outputs of the configurable amplifier 110 and the gain amplifier 120 and signals input from the outside such as the sensor 2, and allows low-frequency components thereof to pass through, and its characteristics and operation can be set according to control from the MCU unit 200. The high-pass filter 140 is an SC filter that removes low-frequency components of outputs of the configurable amplifier 110 and the gain amplifier 120 and signals input from the outside such as the sensor 2, and allows high-frequency components thereof to pass through, and its characteristics and operation can be set according to control from the MCU unit 200.

The variable regulator 150 is a variable voltage source that supplies a voltage to the A/D converter 260 of the MCU unit 200, and its characteristics and operation can be set according to control from the MCU unit 200. The temperature sensor 160 is a sensor that measures the temperature of the semiconductor device 1, and its operation can be set according to control from the MCU unit 200.

The general-purpose amplifier 170 is an amplifier that amplifies a signal that is input from the outside such as the sensor 2, and its operation can be set according to control from the MCU unit 200. The SPI interface 180 is an interface for inputting and outputting data or the like to and from the MCU unit 200 and is connected to the SPI interface 270 of the MCU unit 200 through an SPI bus. Note that when the semiconductor device 1 does not include the MCU unit 200, the SPI interface 180 is connected to an external terminal of the semiconductor device 1, and an external microcontroller, the AFE unit 100 is connected to an external microcontroller and an external microcontroller through the external terminal.

Figure 7:
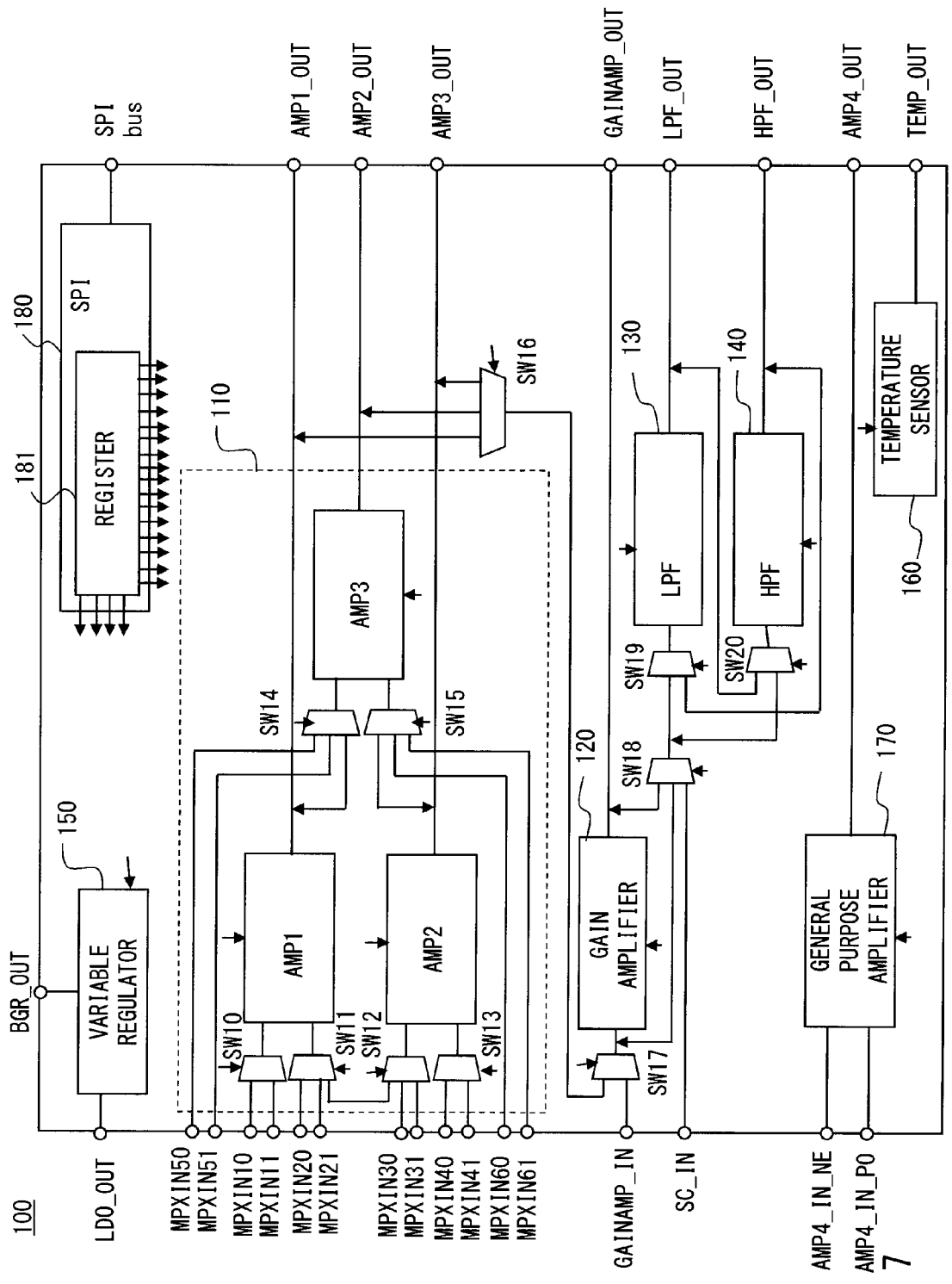
FIG. 7 is a diagram showing the connection relationship among circuits of the semiconductor device according to the fourth embodiment.

The configuration of the AFE unit 100 in the semiconductor device 1 is described in detail hereinafter. FIG. 7 shows connections of circuits in the AFE unit 100. The AFE unit 100 includes a plurality of analog circuit elements (e.g., an amplifier, a resistor, a capacitor or the like) and a switching circuit group (e.g., switching circuit including a switch and a multiplexer) that switches the connection state between the plurality of analog circuit elements.

The SPI interface 180 is connected to external terminals (CS, SCLK, SDO, SDI) that are connected to the SPI bus and includes a register (control register) 181. The configuration information (command) for changing the configuration and characteristics of the circuit is input from the MCU unit 200 through the SPI interface and stored to the register 181. The register 181 is connected to the respective circuits in the AFE unit 100, and the configuration and characteristics of the respective circuits in the AFE unit 100 are set according to the configuration information in the register 181.

The configurable amplifier 110 includes separate amplifiers AMP1, AMP2 and AMP3, and switches SW10 to SW15 for switching input and output of amplifiers are connected.

In the separate amplifier AMP1, one input terminal is connected to MPXIN10 or MPXIN11 through the switch SW10, the other input terminal is connected to MPXIN20 or MPXIN21 through the switch SW11, and the output terminal is connected to AMP1_OUT. Likewise, in the separate amplifier AMP2, one input terminal is connected to MPXIN30 or MPXIN31 through the switch SW12, the other input terminal is connected to MPXIN40 or MPXIN41 through the switch SW13, and the output terminal is connected to AMP2_OUT.

Further, in the separate amplifier AMP3, one input terminal is connected to MPXIN50, MPXIN51 or the output terminal of the AMP1 through the switch SW14, the other input terminal is connected to MPXIN60, MPXIN61 or the output terminal of the AMP2 through the switch SW15, and the output terminal is connected to AMP3 OUT. The output terminals of the AMP1 to AMP3 are connected also to the gain amplifier 120, the low-pass filter 130 and the high-pass filter 140.

In the configurable amplifier 110, the switches SW10 to SW15 are switched according to the set value of the register 181, and thereby the connections of the AMP1 to AMP3 are changed, and the internal circuit format and characteristics are also changed as described later.

Figure 8:
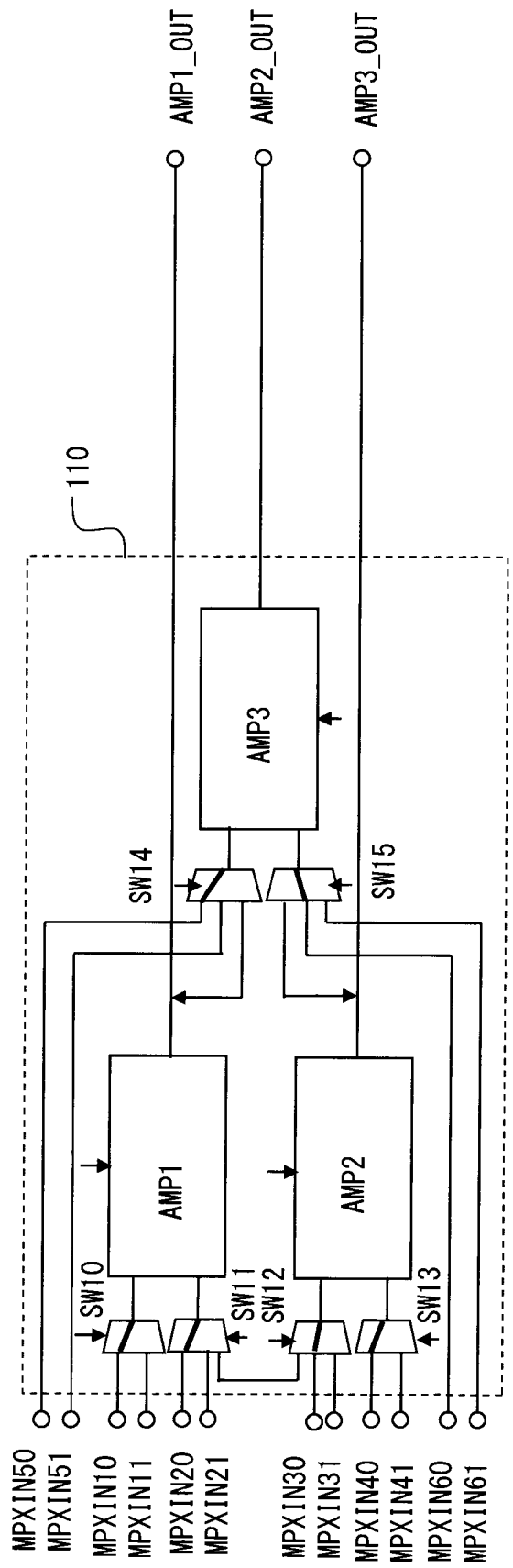
FIG. 8 is a diagram showing a connection example of circuits of the semiconductor device according to the fourth embodiment.
Figure 9:
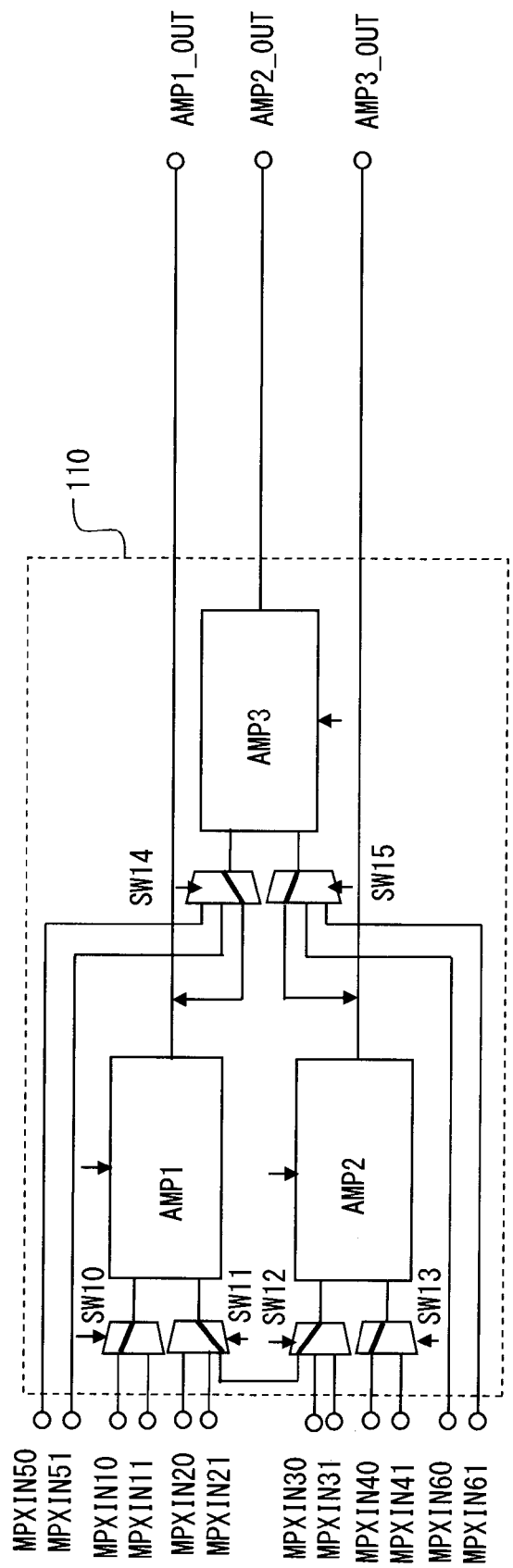
FIG. 9 is a diagram showing a connection example of the circuits of the semiconductor device according to the fourth embodiment.

FIGS. 8 and 9 are examples of switching the connections of the AMP1 to AMP3 by the switches SW10 to SW15. In FIG. 8, by the setting of the register 181, the switches SW10 and SW11 are switched to connect the input terminals of the AMP1 to the MPXIN10 and MPXIN20, the switches SW12 and SW13 are switched to connect the input terminals of the AMP2 to the MPXIN30 and MPXIN40, and the switches SW14 and SW15 are switched to connect the input terminals of the AMP3 to the MPXIN50 and MPXIN60. In these connections, the AMP1, AMP2 and AMP3 can operate as independent amplifiers.

In FIG. 9, by the setting of the register 181, the switch SW10 is switched to connect one input terminal of the AMP1 to the MPXIN10, the switch SW13 is switched to connect one input terminal of the AMP2 to the MPXIN40, the switches SW11 and SW12 are switched to connect the other input terminal of the AMP1 to the other input terminal of the AMP2, the switches SW14 and SW15 are switched to connect one input terminal of the AMP3 to the output terminal of the AMP1 and connect the other input terminal of the AMP3 to the output terminal ref the AMP2. In these connections, an instrumentation amplifier connecting the AMP1 to AMP3 can be configured.

Further, as shown in FIG. 7, switches SW16 and SW17 for switching input are connected to the gain amplifier 120. In the gain amplifier 120, the input terminal is connected to the output terminals of the AMP1 to AMP3 through the switches SW16 and SW17 or connected to GAINAMP_IN through the switch SW17, and the output terminal is connected to GAIN-AMP_OUT. The output terminal of the gain amplifier 120 is connected also to the low-pass filter 130 and the high-pass filter 140. Note that the switch SW16 may be used to switch the connection between the output terminals of the AMP1 to AMP3, external terminals, and the gain amplifiers.

Switches SW18 and SW19 for switching input are connected to the low-pass filter 130, and switches SW18 and SW20 for switching input are connected to the high-pass filter 140. In the low-pass filter 130, the input terminal is connected to the output terminals of the AMP1 to AMP3, the output terminal of the gain amplifier 120 or SC_IN through the switches SW16, SW17, SW18, and SW19, or connected to the output terminal of the gain amplifier 120 through the switch SW19, and the output terminal is connected to LPF_OUT. In the high-pass filter 140, the input terminal is connected to the output terminals of the AMP1 to AMP3, the output terminal of the gain amplifier 120 or SC_IN through the switches SW16, SW17, SW18, and SW19, or connected to the output terminal of the low-pass filter 130 through the switch SW19, and the output terminal is connected to HPF_OUT. Note that a switch may be provided between the output terminals of the low-pass filter 130 and the high-pass filter 140 and the external terminals to switch the connection between the output terminals of the low-pass filter 130 and the high-pass filter 140, the external terminals, and SW19 and SW20.

In the gain amplifier 120, the low-pass filter 130 and the high-pass filter 140, the switches SW16 to SW20 are switched according to the set value of the register 181, and the connections of the gain amplifier 120, the low-pass filter 130 and the high-pass filter 140 are changed, and the internal characteristics are also changed as described later.

Figure 10:
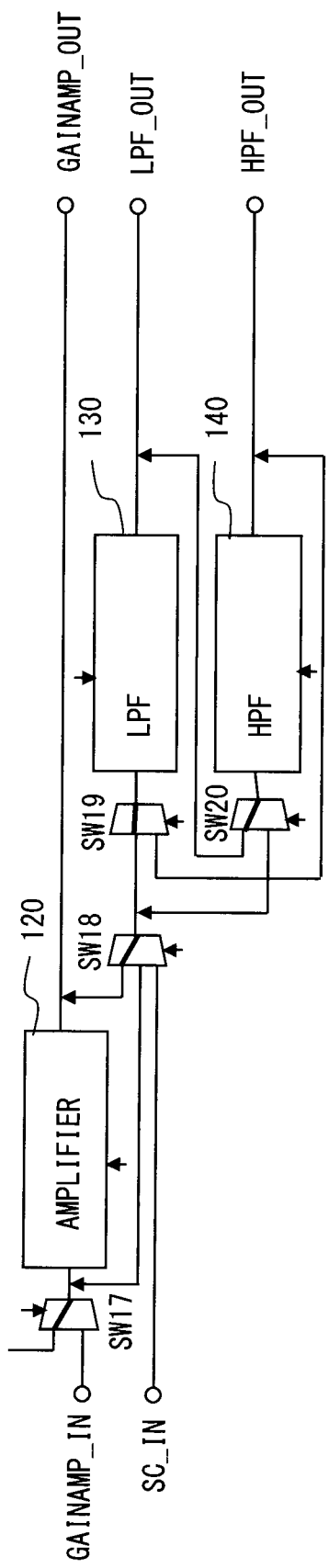
FIG. 10 is a diagram showing a connection example of the circuits of the semiconductor device according to the fourth embodiment.
Figure 11:
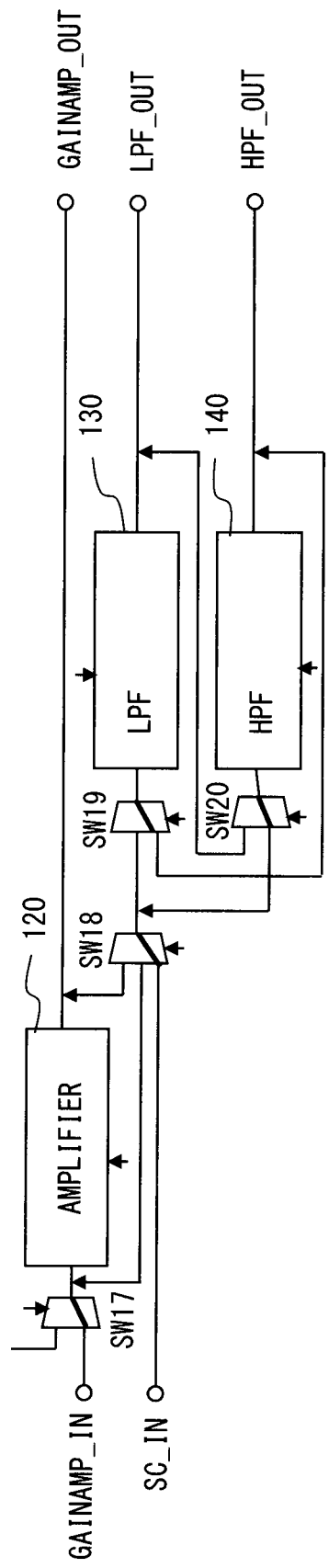
FIG. 11 is a diagram showing a connection example of the circuits of the semiconductor device according to the fourth embodiment.

FIGS. 10 and 11 are examples of switching the connections of the gain amplifier 120, the low-pass filter 130 and the high-pass filter 140 by the switches SW17 to SW20. In FIG. 10, by the setting of the register 181, the switch SW17 is switched to connect the input terminal of the gain amplifier 120 to any output terminal of the AMP1 to AMP3, the switches SW18 and SW19 are switched to connect the input terminal of the low-pass filter 130 to the output terminal of the gain amplifier 120, and the switch SW20 is switched to connect the input terminal of the high-pass filter 140 to the output terminal of the low-pass filter 130. In this switching, a circuit in which any one of the AMP1 to AMP3, the gain amplifier 120, the low-pass filter 130 and the high-pass filter 140 are connected in this order can be formed.

In FIG. 11, by the setting of the register 181, the switch SW17 is switched to connect the input terminal of the gain amplifier 120 to GAINAMP_IN, the switches SW18 and SW20 are switched to connect the input terminal of the high-pass filter 140 to SC_IN, and the switch SW19 is switched to connect the input terminal of the low-pass filter 130 to the output terminal of the high-pass filter 140. In this switching, the gain amplifier 120 can operate as a single independent amplifier, and a circuit in which the high-pass filter 140 and the low-pass filter 130 are connected in this order can be formed.

Further, as shown in FIG. 7, in the variable regulator 150, the output terminal is connected to BGR_OUT and LDO_OUT. The characteristics of the variable regulator 150 are changed as described later according to the set value of the register 181.

In the temperature sensor 160, the output terminal is connected to TEMP_OUT. The characteristics of the temperature sensor 160 are changed as described later according to the set value of the register 181.

In the general-purpose amplifier 170, one input terminal is connected to AMP4_IN_NE, the other input terminal is connected to AMP4_IN_PO, and the output terminal is connected to AMP4_OUT. The general-purpose amplifier is formed by one operational amplifier, and the power on/off is set according to the set value of the register 181.

Next, with reference to FIGS. 12 to 17, a description will be given of a specific circuit configuration of the configurable amplifier 110.

The configurable amplifier 110 is an amplifier for amplifying the sensor output signal, whose topology (circuit configuration) and parameters (circuit characteristics) can be changed according to the setting of the control register. As to the change in the characteristics, gain can be variably set. For example, when an individual amplifier is used independently, gain can be set on a 2 dB basis in the range of 6 dB to 46 dB. When the configurable amplifier 110 is used as an instrumentation amplifier, gain can be set on a 2 dB basis in the range of 20 dB to 60 dB. Further, the through rate can be variably set, and ON/OFF of the power supply can be switched by the power-off mode.

Figure 12:
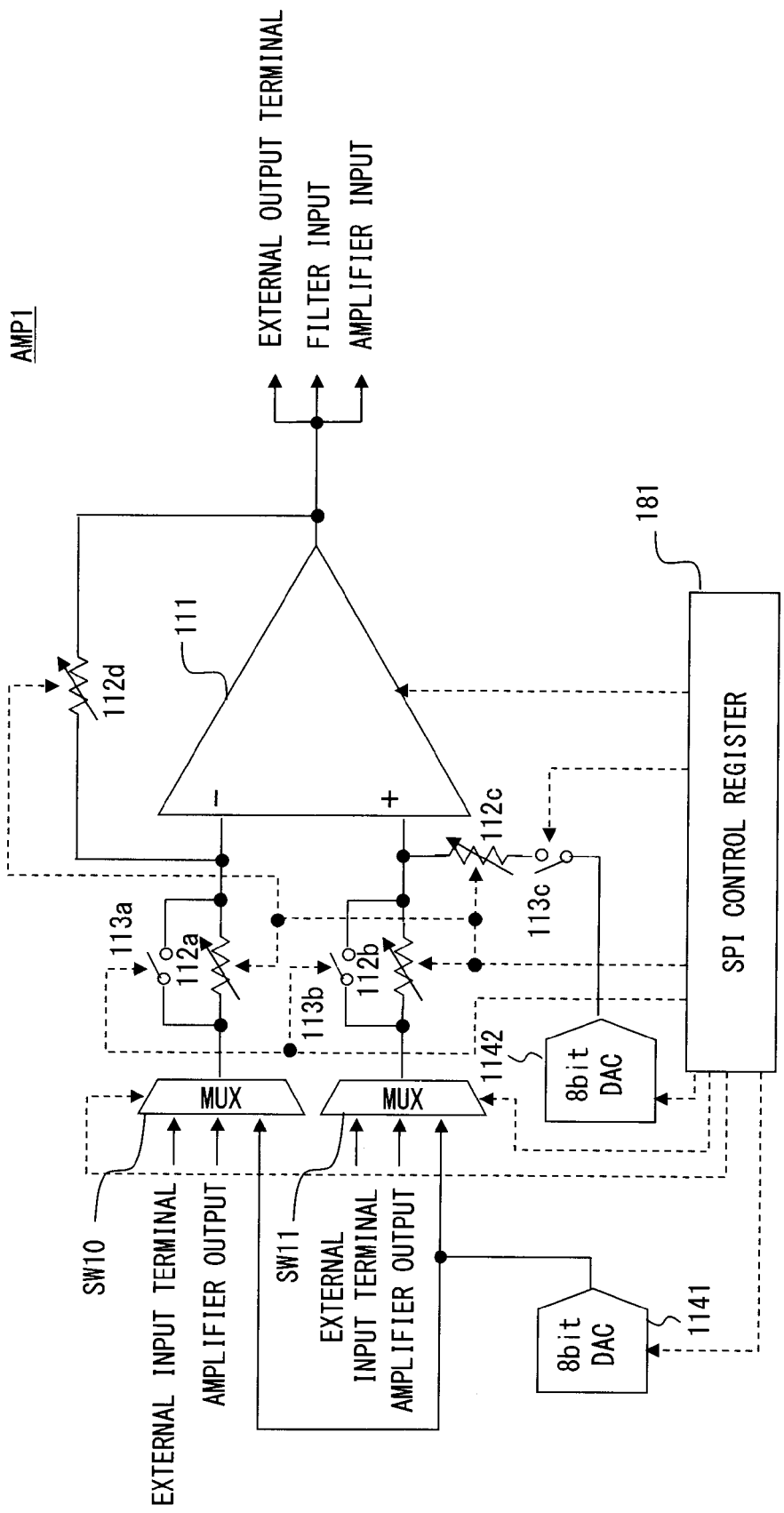
FIG. 12 is a circuit diagram showing the circuit configuration of the semiconductor device according to the fourth embodiment.

FIG. 12 shows a circuit configuration of the individual amplifier AMP1 of the configurable amplifier 110. Note that, AMP2 and AMP3 are similarly configured.

As shown in FIG. 12, the individual amplifier AMP1 has an operational amplifier 111, variable resistors 112a to 112d connected to the terminals of the operational amplifier 111, switches 113a to 113c, and the DACs 1141 and 1142. As shown in FIG. 7, the multiplexers (switches) SW10 and SW11 are connected.

In accordance with the set value of the register 181, the input of the operational amplifier 111 can be switched by the multiplexers SW10 and SW11; presence or absence of the variable resistors (input resistors) 112a and 112b can be switched by the switches 113a and 113h, and connection of the DAC 1142 can be switched by the switch 113c. Note that the connection between the output of the operational amplifier 111 and the gain amplifier 120, the low-pass filter 130, and the high-pass filter 140 is switched by SW16, SW17 and SW18 as shown in FIG. 7. Further, by changing the setting of the resistance value, the DACs 1141 and 1142 of the variable resistors 112a, 112b, 112c, and 112d in accordance with the set value of the register 181, the gain, operating point, offset or the like of the AMP1 can be changed. Further, in accordance with the set value of the register 181, ON/OFF of the power supply can be controlled. Further, by changing the operation mode of the operational amplifier in accordance with the set value of the register 181 to the high-speed mode, the middle-speed mode, and the low-speed mode, the through rate can be controlled.

By switching the switches and the multiplexers, an I/V amplifier, an inverting amplifier, a subtracting (differential) amplifier, a non-inverting amplifier, and a summing amplifier can be configured.

Figure 13:
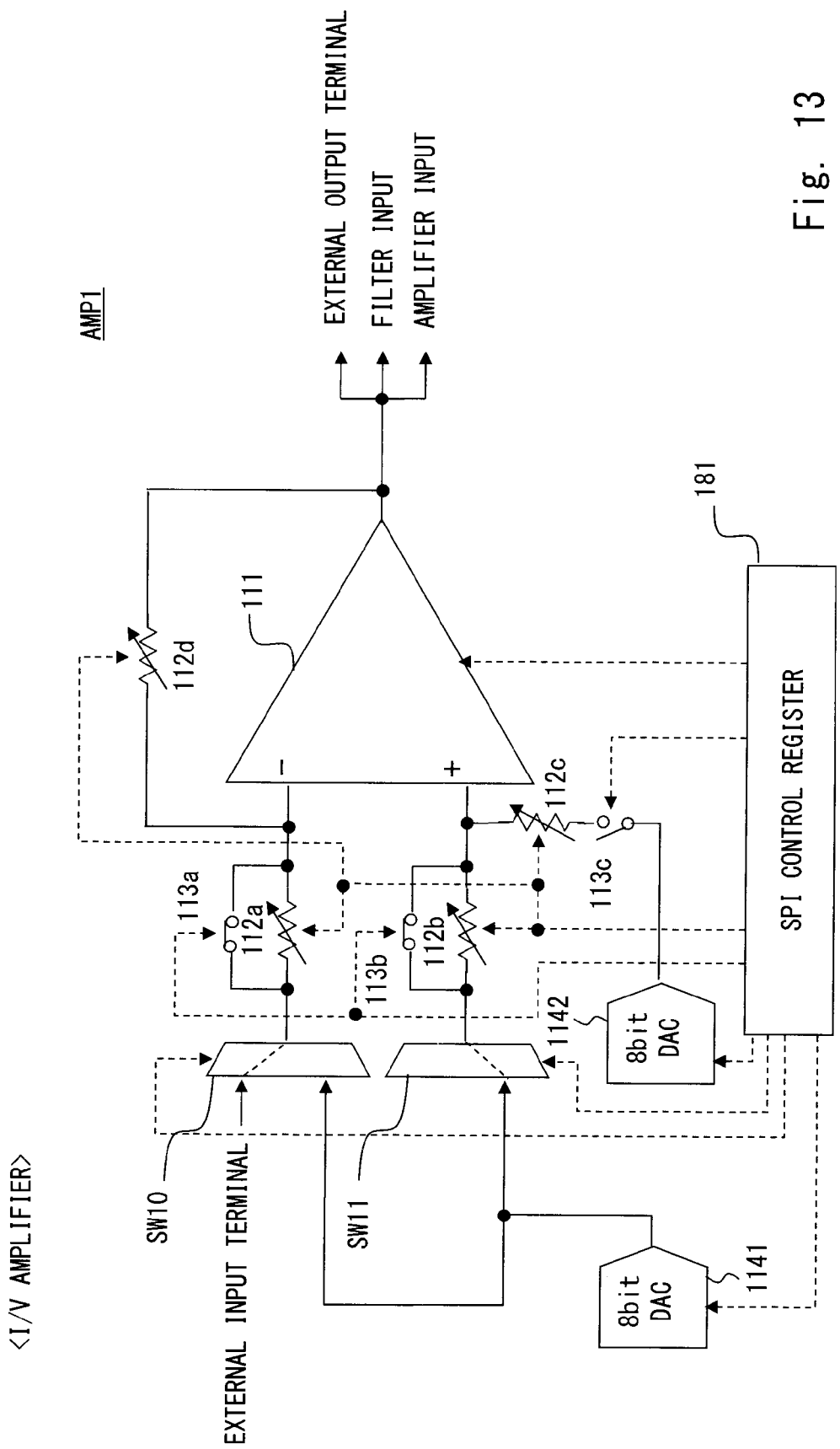
FIG. 13 is a circuit diagram showing an exemplary change in the configuration of the semiconductor device according to the fourth embodiment.

FIG. 13 shows an exemplary configuration of an I/V amplifier. In accordance with the setting of the register 181, the multiplexer SW10 is switched to thereby connect the external input terminal (MPXIN10) to the inverting input terminal; and the switch 113a is turned ON to thereby short-circuit the variable resistor 112a. Further, in accordance with the setting of the register 181, the multiplexer SW11 is switched to thereby connect the DAC 11.41 to the non-inverting input terminal; and the switch 113b is turned ON to thereby short-circuit the variable resistor 112b. By this connection, an I/V amplifier is configured. Further, by changing the resistance value of the variable resistors 112a and 112d in accordance with the setting of the register 181, the gain of the amplifier is set. With this I/V amplifier, when the signal of a current-type sensor is input from the external input terminal, the I/V amplifier converts input current into voltage and outputs the voltage.

Figure 14:
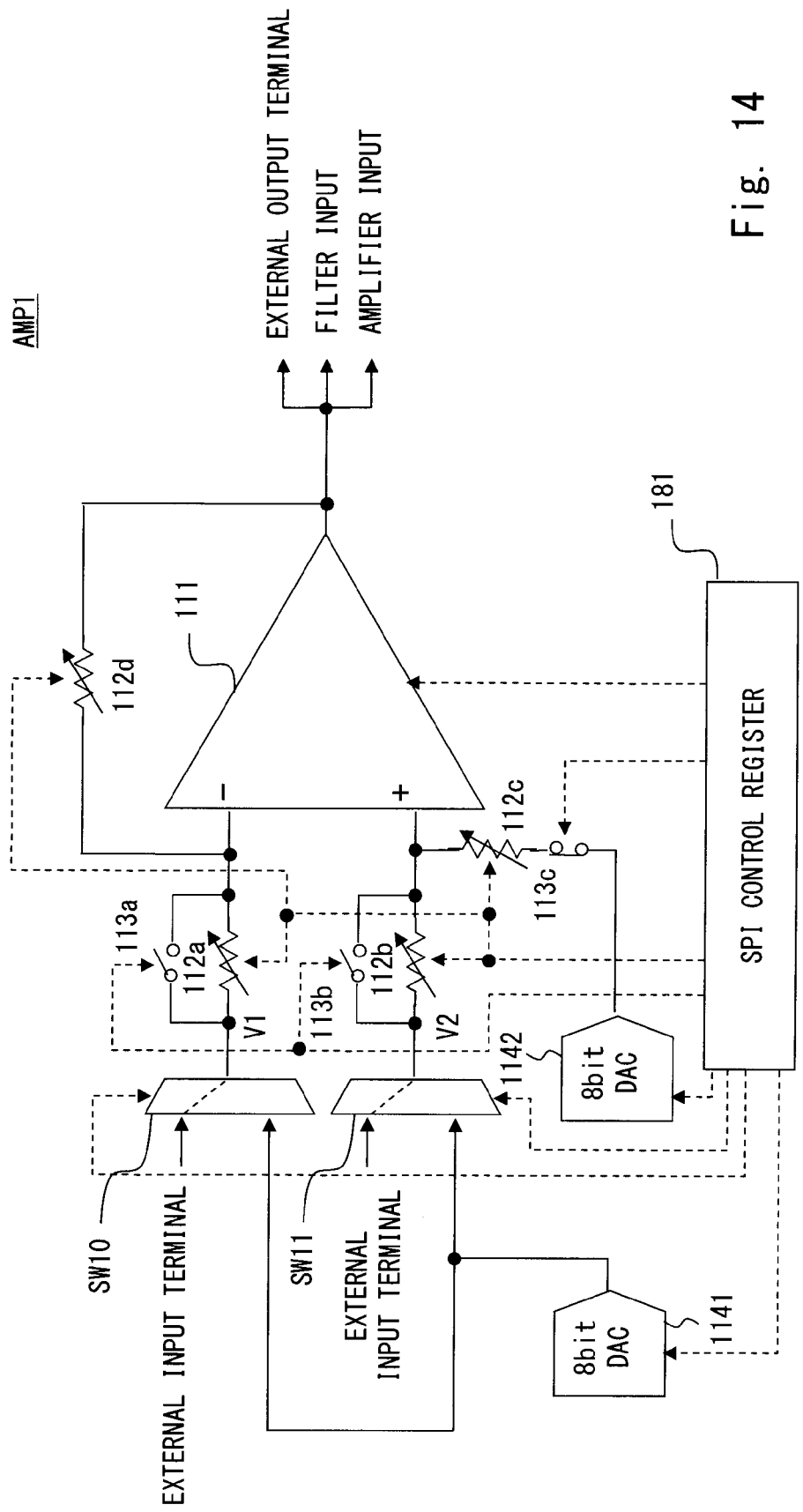
FIG. 14 is a circuit diagram showing an exemplary change in the configuration the semiconductor device according to the fourth embodiment.

FIG. 14 shows an exemplary configuration of a subtracting (differential) amplifier. In accordance with the setting of the register 181, the multiplexers SW10 and SW11 are switched, to thereby connect the external input terminal (MPXIN10) to the inverting input terminal and connect the external input terminal (MPXIN20) to the non-inverting input terminal. Further, by the setting of the register 181, the switch 113c is turned ON to thereby connect the output of the DAC 1142 to the non-inverting input terminal. By this connection, a subtracting amplifier is configured. Further, in accordance with the setting of the register 181, the resistance values of the variable resistors 112a, 112b, and 112d are set, to thereby set the gain of the amplifier. When the subtracting amplifier receives two signals (V1, V2) from the external input terminal, the subtracting amplifier outputs the voltage (V2−V1) obtained by subtracting one input voltage from other input voltage.

Note that summing amplifier can be configured by appropriately changing the configuration of the individual amplifier AMP1 shown in FIG. 12 so as to correspond to the configuration of the summing amplifier 33 shown in FIG. 4.

Figure 15:
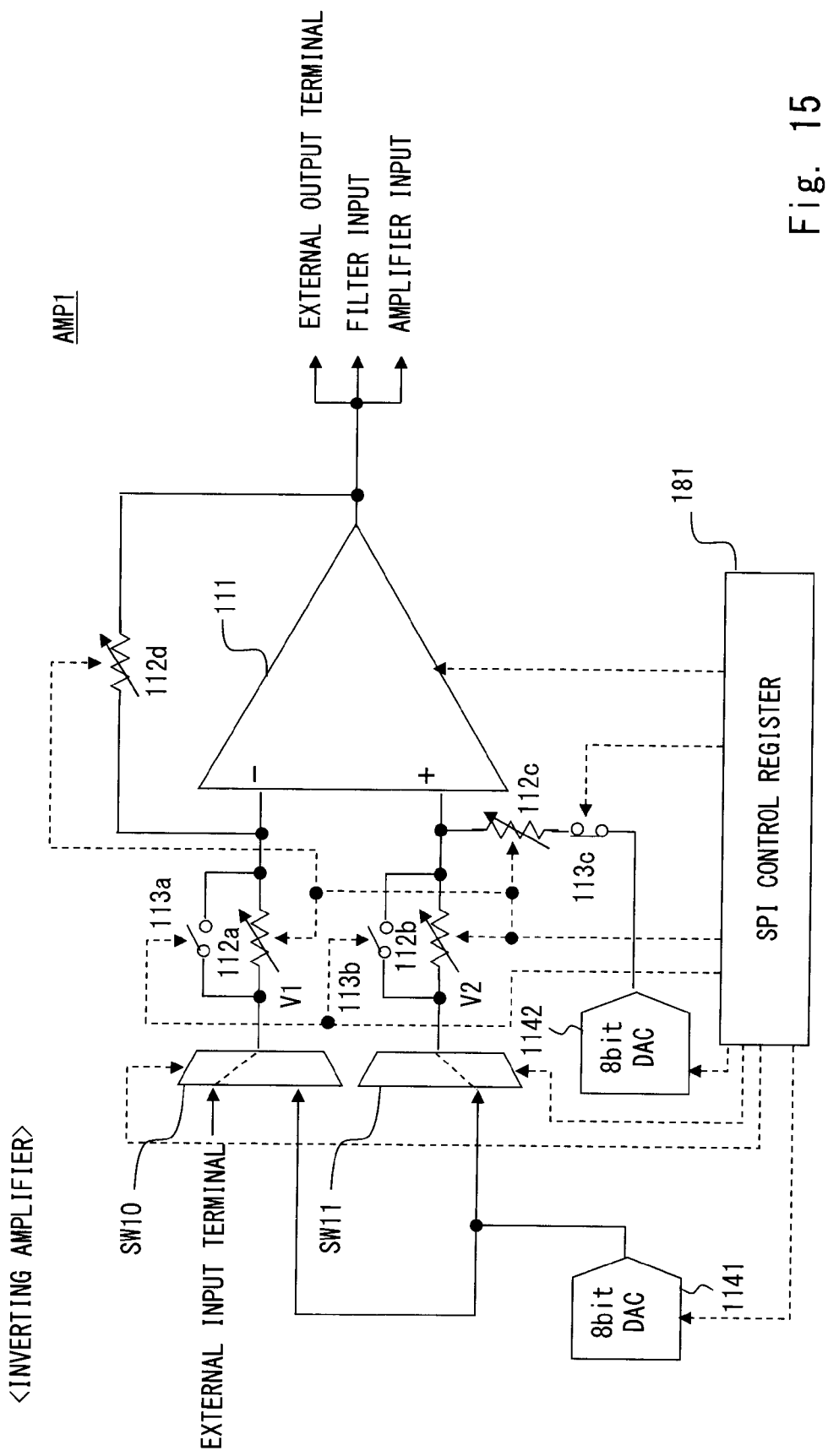
FIG. 15 is a circuit diagram showing an exemplary change in the configuration of the semiconductor device according to the fourth embodiment.

FIG. 15 shows an exemplary configuration of an inverting amplifier. In accordance with the setting of the register 181, the multiplexer SW10 is switched to thereby connect the external input terminal (MPXIN10) to the inverting input terminal, and the switch 113c is turned ON to thereby connect the output of the DAC 1142 to the non-inverting input terminal. By this connection, the inverting amplifier equivalent to that shown in FIG. 1 is configured. Further, in accordance with the setting of the register 181, by changing the resistance values of the variable resistors 112a and 112d, the gain of the amplifier is set, and by changing the output voltage of the DAC, the operating point and offset of the amplifier are adjusted. When the inverting amplifier receives the signal of the voltage-type sensor from the external input terminal, the inverting amplifier outputs the voltage obtained by inverting and amplifying the input voltage.

Figure 16:
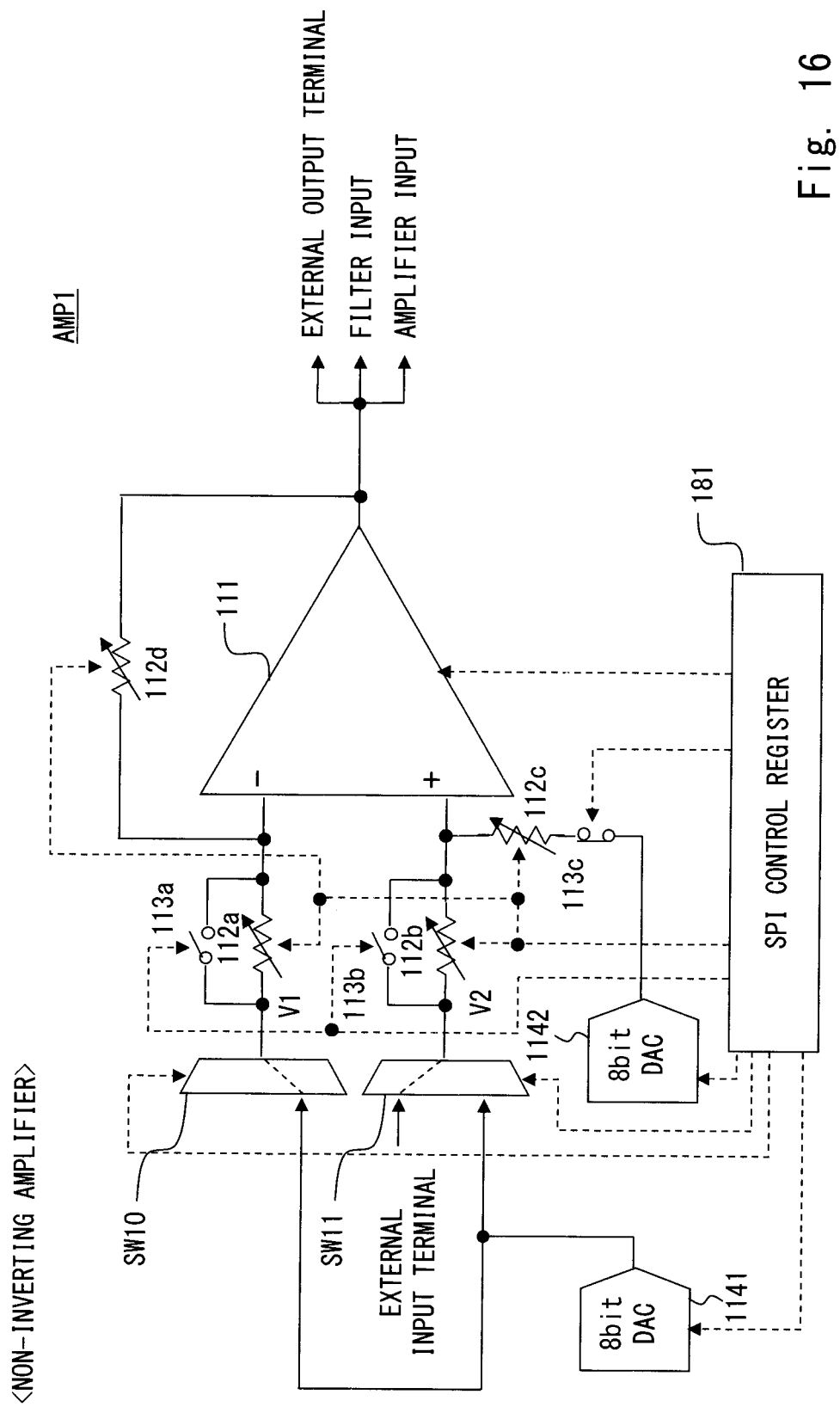
FIG. 16 is a circuit diagram showing an exemplary change in the configuration of the semiconductor device according to the fourth embodiment.

FIG. 16 shows an exemplary configuration of a non-inverting amplifier. In accordance with the setting of the register 181, the multiplexer SW10 is switched to thereby connect the output of the DAC 1141 to the inverting input terminal, and the multiplexer SW11 is switched to thereby connect the external input terminal (MPXIN20) to the non-inverting input terminal. Further, in accordance with the setting of the register 191, the switch 113c is turned ON to thereby connect the output of the DAC 1142 to the non-inverting input terminal. By this connection, a non-inverting amplifier equivalent to that shown in FIG. 7 is configured. Further, in accordance with the setting of the register 181, by changing the resistance values of the variable resistors 112a and 112d, the gain of the amplifier is set; by changing the output voltage of the DAC, the operating point and offset of the amplifier are adjusted. When the non-inverting amplifier receives a signal of a voltage-type sensor from the external input terminal, the non-inverting amplifier outputs a voltage (of the same phase as the input) obtained by subjecting the input voltage to non-inverting amplification.

Figure 17:
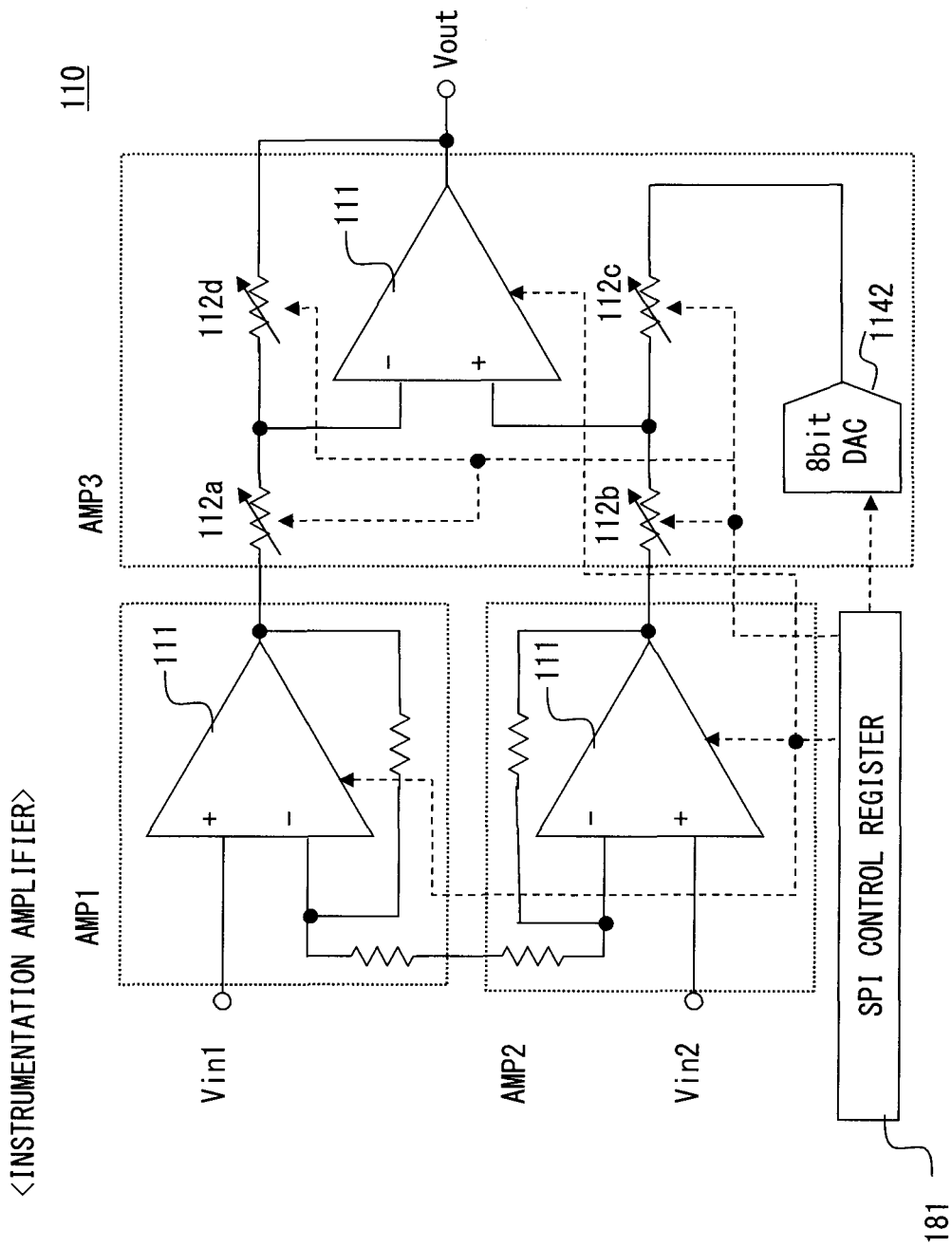
FIG. 17 is a circuit diagram showing an exemplary change in the configuration of the semiconductor device according to the fourth embodiment.

FIG. 17 shows an exemplary configuration of an instrumentation amplifier with AMP1 to AMP3. As shown in FIG. 9, in accordance with the setting of the register 181, by connecting AMP1 to AMP3 by the multiplexers (switches) SW10 to SW15, the instrumentation amplifier shown in FIG. 17 can be configured. Note that though the switches and the like are not shown, in AMP1, the switch 113b is turned ON to thereby short-circuit the variable resistor 112b; in AMP2, the switch 113b is turned ON to thereby short-circuit the variable resistor 112b; and in AMP3, the switch 113c is turned ON to thereby connect the DAC 1142 to the non-inverting input terminal.

Further, in accordance with the setting of the register 181, by changing the resistance values of the variable resistors 112a to 112d of the AMP3, the gain of the instrumentation amplifier is set; and by changing the output voltage of the DAC 1142, the operating point and offset of the instrumentation amplifier are adjusted. When a minor differential signal is input from the external input terminal, the instrumentation amplifier subjects the differential signal to non-inverting amplification by AMP1 and AMP2, and outputs a voltage obtained by differential amplification performed by AMP3.

Note that, the semiconductor device according to the fourth embodiment may further include a first selector provided at the other end of the first resistor, and a second selector provided at the other end of the third resistor. The first selector selects one of the input signal and the first bias voltage in accordance with a select signal. The second selector selects, in accordance with the select signal, other one of the input signal and the first bias voltage. In this case, by the first and second selectors being controlled in accordance with the select signal, an inverting amplifier, a non-inverting amplifier or the like can be configured. Then, in this case, the offset voltage can be corrected in an optimum manner in accordance with the type of the amplifier.

Further, the semiconductor device according to the fourth embodiment may further include: a first switch circuit whose one end is connected to one end of the first resistor and the output of the first selector, other end of the first switch circuit being connected to the other end of the first resistor and the inverting input terminal; a second switch circuit whose one end is connected to one end of the third resistor and the output of the second selector, other end of the second switch circuit being connected to the other end of the third resistor and the non-inverting input terminal; and a third switch circuit whose one end is connected to the second variable voltage source, other end of the third switch circuit being connected to one end of the fourth resistor. The first switch circuit, the second switch circuit, and the third switch circuit may perform switching in accordance with the select signal. In this case, by the first and second selectors and the first to third switch circuits being controlled, a configurable amplifier whose circuit configuration is variable can be configured. For example, it can be used as an inverting amplifier, a non-inverting amplifier, a summing amplifier, an I/V amplifier, a differential amplifier, an instrumentation amplifier and the like. Then, in this case, the offset voltage can be corrected in an optimum manner according to the type of the amplifier.

Note that, the magnitude of the output signal and the operating point of the sensor 2 connected to the semiconductor device 1 according to the fourth embodiment varies depending on its type. Here, the exemplary types of the sensor 2 may include an acceleration sensor, a tilt (3D) sensor, a temperature sensor, and an illumination sensor. However, the types are not limited thereto. However, it is necessary to provide a signal of a certain magnitude range to the rear stage circuit of the sensor 2. Here, with the semiconductor device 1 according to the fourth embodiment, the amplifying rate of the amplifier circuit in the semiconductor device 1 can be switched in accordance with the type of the sensor 2. That is, the semiconductor device 1 can be operated to change the circuit configuration of the amplifier for each type of the sensor 2, and to change the control signals (a first set value and a second set value) to the DACs 1141 and 1142. This brings about a special effect that the operating point and the offset voltage can be corrected in an optimum manner in accordance with the type of the sensor 2.

Further, the semiconductor device 1 according to the fourth embodiment can be used for a plurality of applications. Here, the signal route is changed by switching the multiplexers and switches of AMP1 to AMP3 of the AFE unit 100. This brings about a special effect that the offset voltage can be adjusted to be an optimum for each application.

Other Embodiment

Note that the semiconductor devices according to the first to fourth embodiments each have two variable voltage sources for one amplifier circuit, whose output signal can be used as the reference voltage of the amplifier circuit. Here, the variable voltage sources are controlled independently, and used to adjust the input/output bias voltage of the amplifier circuit. That is, by allowing the first variable voltage source to perform a rough adjustment, and then allowing the second variable voltage source to perform a more fine adjustment, the offset voltage can be corrected with high precision.

Note that the aforementioned program can be provided to a computer to be stored in various types of non-transitory computer readable media. Non-transitory computer readable media include various types of tangible storage media. Examples of non-transitory computer readable media include magnetic storage media (e.g., flexible disks, magnetic tapes, and hard disk drives), optical magnetic storage media (e.g., magneto-optical disks), CD-ROM (Read Only Memory), CD-R, CD-R/W, semiconductor memories (e.g., mask ROM, PROM (Programmable ROM), EPROM (Erasable PROM), flash ROM, and RAM (Random Access Memory)). Further, the program may be provided to a computer using various types of transitory computer readable media. Examples of transitory computer readable media include electric signals, optical signals and electromagnetic waves. Transitory computer readable media can provide the program to a computer via a wired communication line such as electric wires and optical fibers, or a wireless communication line.

In the foregoing, the invention made by the inventors has been specifically described based on the embodiments. However, it goes without saying that the present invention is not limited to the embodiments described above, and various changes can be made within the range not departing from the gist of the invention.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The first, second, third and fourth embodiments can be combined as desirable by one of ordinary skill in the art.

What is claimed is:
1. A semiconductor device comprising:
an amplifier circuit that has an inverting input terminal, a non-inverting input terminal, and an output terminal;
a first variable voltage source that generates a first bias voltage having a voltage value corresponding to a first set value;

a second variable voltage source that generates a second bias voltage having a voltage value corresponding to a second set value;

a first resistor whose one end is connected to the inverting input terminal;

a second resistor that is connected between the output terminal and the inverting input terminal;

a third resistor whose one end is connected to the non-inverting input terminal; and a fourth resistor that is connected between the second variable voltage source and the non-inverting input terminal, wherein the first bias voltage is provided to at least one of other end of the first resistor and other end of the third resistor, and an input signal is provided to at least other one of the other end of the first resistor and the other end of the third resistor.

2. The semiconductor device according to claim 1, wherein the first resistor and the third resistor have an identical resistance value, and the second resistor and the fourth resistor have an identical resistance value.

3. The semiconductor device according to claim 1, wherein the first bias voltage is provided to the other end of the third resistor, and the input signal is provided to the other end of the first resistor.

4. The semiconductor device according to claim 1, wherein the first bias voltage is provided to the other end of the first resistor, and the input signal is provided to the other end of the third resistor.

5. The semiconductor device according to claim 1, wherein the first bias voltage is provided to the other end of the third resistor, the input signal is provided to the other end of the first resistor, the semiconductor device further comprises a fifth resistor whose one end is connected to the inverting input terminal, and other input signal except for the input signal is provided to other end of the fifth resistor.

6. The semiconductor device according to claim 1, further comprising:

a first selector provided at the other end of the first resistor; and a second selector provided at the other end of the third resistor, wherein the first selector selects one of the input signal and the first bias voltage in accordance with a select signal, and the second selector selects, in accordance with the select signal, other one of the input signal and the first bias voltage.

7. The semiconductor device according to claim 6, further comprising:

a first switch circuit whose one end is connected to one end of the first resistor and an output of the first selector, other end of the first switch circuit being connected to the other end of the first resistor and the inverting input terminal;

a second switch circuit whose one end is connected to one end of the third resistor and an output of the second selector, other end of the second switch circuit being connected to the other end of the third resistor and the non-inverting input terminal; and a third switch circuit whose one end is connected to the second variable voltage source, other end of the third switch circuit being connected to one end of the fourth resistor, wherein the first switch circuit, the second switch circuit, and the third switch circuit perform switching in accordance with the select signal.

8. The semiconductor device according to claim 1, wherein the first bias voltage has a voltage value corresponding to an ideal value for an amplitude center of an output signal being output from the amplifier circuit, and the second bias voltage has a voltage value corresponding to a shift amount with reference to the amplitude center.

9. The semiconductor device according to claim 1, wherein the first variable voltage source is a digital-to-analog converter that converts an analog signal obtained by conversion of the output signal output from the amplifier circuit into a digital signal based on the first set value to generate the first bias voltage, and the second variable voltage source is a digital-to-analog converter that converts the analog signal into a digital signal based on the second set value to generate the second bias voltage.

10. A semiconductor device comprising:

an amplifier circuit that has an inverting input terminal, a non-inverting input terminal, and an output terminal;

a first resistor whose one end is connected to the inverting input terminal;

a second resistor that is connected between the output terminal and the inverting input terminal;

a third resistor whose one end is connected to the non-inverting input terminal;

a fourth resistor whose one end is connected to the non-inverting input terminal;

a first variable voltage source that generates a first bias voltage having a voltage value corresponding to a first set value, the first variable voltage source providing the first bias voltage to at least one of other end of the first resistor and other end of the third resistor; and a second variable voltage source that generates a second bias voltage having a voltage value corresponding to a second set value, the second variable voltage source providing the second bias voltage to other end of the fourth resistor, wherein an ideal value for an operating point of the amplifier circuit is set by the first bias voltage, and a shift amount of the amplifier circuit with reference to the ideal value for the operating point is corrected by the second bias voltage.

11. An offset voltage correcting method for a semiconductor device that includes:

an amplifier circuit that has an inverting input terminal, a non-inverting input terminal, and an output terminal;

a first resistor whose one end is connected to the inverting input terminal;

a second resistor that is connected between the output terminal and the inverting input terminal;

a third resistor whose one end is connected to the non-inverting input terminal;

a fourth resistor whose one end is connected to the non-inverting input terminal;

a first variable voltage source that generates a first bias voltage having a voltage value corresponding to a first set value, the first variable voltage source providing the first bias voltage to at least one of other end of the first resistor and other end of the third resistor; and a second variable voltage source that generates a second bias voltage having a voltage value corresponding to a second set value, the second variable voltage source providing the second bias voltage to other end of the fourth resistor, wherein the offset voltage correcting method comprises:

setting an ideal value for an operating point of the amplifier circuit by the first bias voltage, and correcting a shift amount of the operating point of the amplifier circuit with reference to the ideal value by the second bias voltage.

12. The offset voltage correcting method according to claim 11, further comprising:

setting the first set value to the first variable voltage source so that the first bias voltage approximates a signal value of an input signal of the amplifier circuit; and thereafter, setting the second set value to the second variable voltage source for generating the second bias voltage that approximates a potential of the non-inverting input terminal to a potential of the inverting input terminal.

13. The offset voltage correcting method according to claim 12, wherein the first variable voltage source and the second variable voltage source are each a digital-to-analog converter, in the first variable voltage source, an analog signal obtained by conversion of an output signal output from the amplifier circuit is converted into a digital signal based on the first set value to generate the first bias voltage, and in the second variable voltage source, the analog signal is converted into a digital signal based on the second set value to generate the second bias voltage.

* * * * *